United States Patent
Tsai et al.

(10) Patent No.: US 12,408,460 B2
(45) Date of Patent: Sep. 2, 2025

(54) IMAGE SENSOR AND METHOD OF FORMING THE SAME

(71) Applicant: VisEra Technologies Company Limited, Hsin-Chu (TW)

(72) Inventors: Wei-Lung Tsai, Tainan (TW); Shin-Hong Kuo, New Taipei (TW); Huang-Jen Chen, Hsin-Chu (TW); Yu-Chi Chang, Hukou Township, Hsinchu County (TW); Ching-Chiang Wu, Zhubei (TW); Han-Lin Wu, Hsin-Chu (TW); Hung-Jen Tsai, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 833 days.

(21) Appl. No.: 17/391,450

(22) Filed: Aug. 2, 2021

(65) Prior Publication Data

US 2023/0029820 A1  Feb. 2, 2023

(51) Int. Cl.
H10F 39/00 (2025.01)
H10K 39/32 (2023.01)

(52) U.S. Cl.
CPC ......... *H10F 39/807* (2025.01); *H10F 39/024* (2025.01); *H10F 39/8053* (2025.01); *H10F 39/8063* (2025.01); *H10F 39/811* (2025.01); *H10K 39/32* (2023.02)

(58) Field of Classification Search
CPC .............................. H10F 39/807; H10F 39/191
See application file for complete search history.

(56) References Cited

U.S. PATENT DOCUMENTS

2006/0187327 A1* 8/2006 Mabuchi ........... H01L 27/14632
348/294
2008/0224136 A1 9/2008 Wang et al.
2008/0246107 A1* 10/2008 Maehara ........... H01L 27/14687
257/E31.127

(Continued)

FOREIGN PATENT DOCUMENTS

CN 113161377 A 7/2021
JP H03-244155 A 10/1991

(Continued)

OTHER PUBLICATIONS

Wo 2012/035702 A1—machine translation (Year: 2024).*

*Primary Examiner* — Vincent Wall
(74) *Attorney, Agent, or Firm* — MUNCY, GEISSLER, OLDS & LOWE, P.C.

(57) ABSTRACT

An image sensor is provided. The image sensor includes a substrate, an isolation structure on the substrate, a photoelectric conversion layer, a transparent electrode layer, an encapsulation layer, a color filter layer, and a micro-lens. The isolation structure is electrically non-conductive and defines a plurality of pixel regions on the substrate. The isolation structure prevents cross-talk of electrical signals among pixels. The photoelectric conversion layer is disposed on the pixel regions defined by the isolation structure. The transparent electrode layer is disposed over the isolation structure and the photoelectric conversion layer. The encapsulation layer is disposed over the transparent electrode layer. The micro-lens is disposed on the color filter layer.

12 Claims, 14 Drawing Sheets

(56) References Cited

U.S. PATENT DOCUMENTS

| | | | |
|---|---|---|---|
| 2010/0060756 A1* | 3/2010 | Inuiya | H01L 27/14621 |
| | | | 348/280 |
| 2015/0061062 A1* | 3/2015 | Lin | H01L 27/14623 |
| | | | 438/69 |
| 2015/0076643 A1* | 3/2015 | Kikuchi | H01L 27/14685 |
| | | | 438/73 |
| 2015/0091115 A1* | 4/2015 | Lin | H01L 27/14667 |
| | | | 257/432 |
| 2017/0186788 A1* | 6/2017 | Yen | H01L 27/14636 |
| 2017/0243912 A1* | 8/2017 | Kaneda | H01L 27/14621 |
| 2017/0271383 A1* | 9/2017 | Lai | H01L 27/14654 |
| 2018/0130834 A1* | 5/2018 | Lee | H01L 27/14683 |
| 2018/0158850 A1* | 6/2018 | Wu | H01L 27/14621 |
| 2019/0067357 A1 | 2/2019 | Cheng et al. | |
| 2019/0096951 A1 | 3/2019 | Cheng et al. | |
| 2019/0148450 A1* | 5/2019 | Wei | H01L 27/1463 |
| | | | 257/184 |
| 2019/0267420 A1 | 8/2019 | Lee | |
| 2019/0312073 A1* | 10/2019 | Huang | H01L 27/14643 |
| 2020/0403025 A1* | 12/2020 | Kim | H01L 27/1464 |

FOREIGN PATENT DOCUMENTS

| | | | | |
|---|---|---|---|---|
| JP | 2005033002 A | 2/2005 | | |
| JP | 2009-212377 A | 9/2009 | | |
| JP | 2010-067827 A | 3/2010 | | |
| JP | 2015073070 A | 4/2015 | | |
| TW | 201913985 A | 4/2019 | | |
| TW | 202115894 A | 4/2021 | | |
| WO | WO-2012035702 A1 * | 3/2012 | | H01L 27/14603 |

* cited by examiner

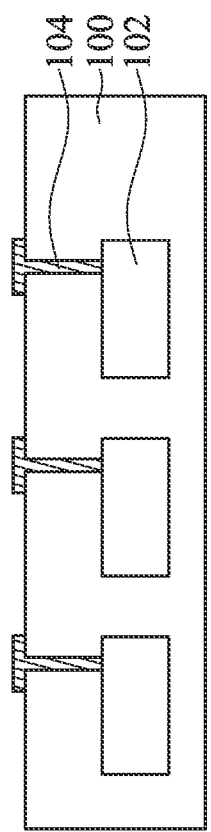
FIG. 1A
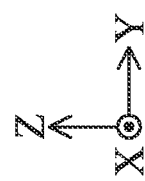

IMAGE SENSOR AND METHOD OF FORMING THE SAME

BACKGROUND

Technical Field

The present disclosure relates in general to an image sensor, and in particular, it relates to an image sensor having an isolation structure.

Description of the Related Art

Solid-state image sensors (e.g., charge-coupled device (CCD) image sensors, complementary metal-oxide semiconductor (CMOS) image sensors, and so on) have been widely used in various image-capturing apparatuses such as digital still-image cameras, digital video cameras, and the like. The light-sensing portion of a solid-state image sensor may be formed at each of a plurality of pixels, and signal electric charges may be generated according to the amount of light received by the light-sensing portion. In addition, the signal electric charges generated in the light-sensing portion may be transmitted and amplified, whereby an image signal is obtained.

Recently, the trend has been for the pixel size of image sensors typified by CMOS image sensors to be reduced for the purpose of increasing the number of pixels per unit area so as to provide high-resolution images. However, while pixel size continues to decrease, there are still various challenges in the design and manufacturing of image sensors. For example, cross-talk of electrical signals among pixels will be a serious problem with smaller pixel sizes, which may have an adverse influence on the performance of the image sensors. New manufacturing techniques are also needed to decrease the pixel size further without leading to serious cross-talk of electrical signals among pixels. Therefore, these and related issues need to be addressed by improving the design and manufacture of image sensors.

SUMMARY

In accordance with some embodiments of the disclosure, an image sensor is provided. The image sensor includes a substrate, an isolation structure on the substrate, a photoelectric conversion layer, a transparent electrode layer, an encapsulation layer, a color filter layer, and a micro-lens layer. The isolation structure is electrically non-conductive and defines a plurality of pixel regions on the substrate. The isolation structure prevents cross-talk of electrical signals among pixels. The photoelectric conversion layer is disposed on the pixel regions defined by the isolation structure. The transparent electrode layer is disposed over the isolation structure and the photoelectric conversion layer. The encapsulation layer is disposed over the transparent electrode layer. The micro-lens is disposed on the color filter layer.

In accordance with some other embodiments of the disclosure, a method of forming an image sensor is provided. The method includes providing a substrate. The method also includes forming an isolation structure on the substrate, wherein the isolation structure is electrically non-conductive and defines a plurality of pixel regions on the substrate. The method also includes forming a photoelectric conversion layer disposed on the pixel regions defined by the isolation structure, wherein the isolation structure prevents electrical signals in the photoelectric conversion layer among the pixel regions. The method also includes forming a transparent electrode layer over the isolation structure and the photoelectric conversion layer. The method also includes forming an encapsulation layer over the transparent electrode layer. The method also includes forming a color filter layer disposed over the encapsulation layer corresponding to the pixel regions. The method further includes forming a micro-lens layer disposed on the color filter layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIGS. 1A-1D illustrate cross-sectional views of various stages in the manufacturing of an image sensor, in accordance with some embodiments of the present disclosure.

DETAILED DESCRIPTION

Figure 1B:
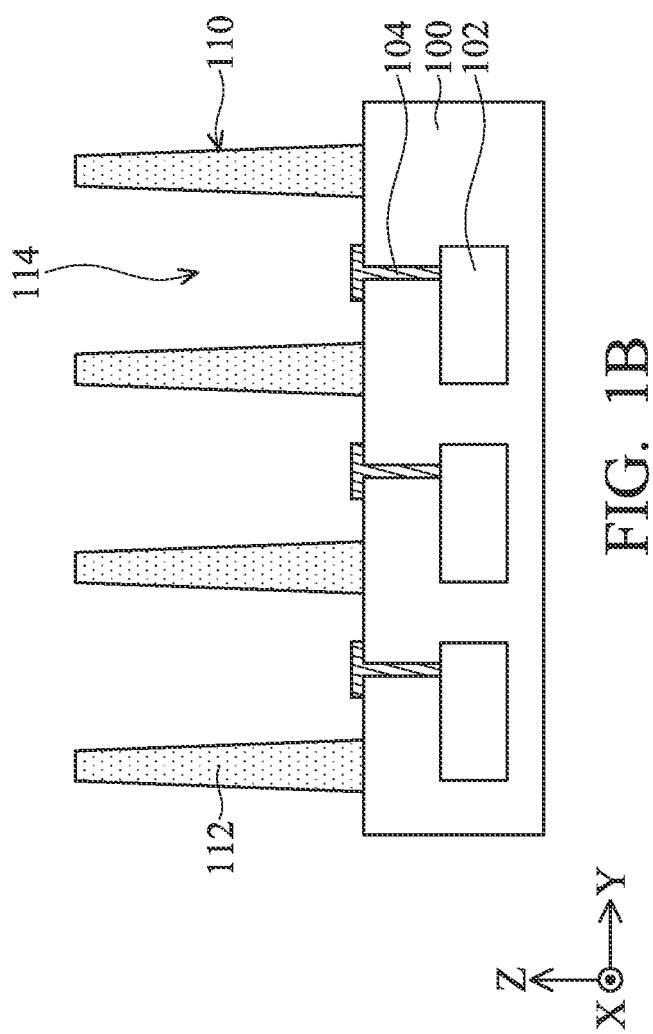

The image sensor of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the concept of the present disclosure may be embodied in various forms without being limited to those exemplary embodiments.

In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "upper" or "top" are used to describe the position of one element relative to another. It should be appreciated that if a device is flipped upside down, an element that is "lower" will become an element that is "upper".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

The terms "about" and "substantially" typically mean+/−10% of the stated value, more typically mean+/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the disclosure, an image sensor including an electrically non-conductive isolation structure among pixels is provided. In particular, a photovoltaic material for an image sensor may be patterned by the isolation structure to form a photoelectric conversion layer covering at least a portion of the isolation structure. By forming the above isolation structure, electron/hole cross-talk in the organic material among pixels will be prevented, which allows the image sensor with smaller pixel size to be formed without cross-talk adversely affecting the performance of the image sensor.

FIGS. 1A-1D illustrate cross-sectional views of various stages in the manufacturing of an image sensor, in accordance with some embodiments of the present disclosure.

Referring to FIG. 1A, a substrate 100 is provided. In some embodiments, the substrate 100 may be, for example, a wafer or a chip, but the present disclosure is not limited thereto. In some embodiments, the substrate 100 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb) an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof.

Then, referring to FIG. 1A, a plurality of sensing devices 102 are embedded in the substrate 100, in accordance with some embodiments of the present disclosure. The plurality of sensing devices 102 may be disposed corresponding to each of the pixel regions which will be defined on the substrate 100 in subsequent manufacturing stages. In some embodiments, the sensing devices 102 are isolated from each other by isolation regions (not shown) in the substrate 100, such as shallow trench isolation (STI) regions or deep trench isolation (DTI) regions. The isolation regions may be formed in the substrate 100 using etching process to form trenches and filling the trenches with an insulating or dielectric material.

The sensing devices 102 may include a variety of elements depending on the function of the resulting image sensor. For example, in some embodiments, the sensing devices 102 include charge storage portions, which serve to store signal charges generated in a subsequently formed photoelectric conversion layer in each pixel. In some embodiments, the sensing devices 102 include signal read-out circuits, each of which serves to output a voltage signal corresponding to the signal charge stored in an associated charge storage portion.

Then, as shown in FIG. 1A, each of the sensing devices 102 may be electrically connected to a conductive portion 104. The conductive portion 104 may further extends to a top surface of the substrate 100 to electrically connect to a subsequently formed photoelectric conversion layer (for example, a photoelectric conversion layer 120 as described below) over the substrate 100.

Referring to FIG. 1B, an isolation structure 110 is formed on the substrate 100, wherein the isolation structure 110 defines a plurality of pixel regions 114 on the substrate 100. The isolation structure 110 is formed with isolation walls 112, and the isolation walls 112 are portions of the isolation structure 110 between adjacent ones of the pixel regions 114. In some embodiments, the angle between the sidewall and the bottom surface of the isolation walls 112 (referred to hereinafter as the sidewall angle of the isolation walls 112) is between 60° and 120°. According to some embodiments of the present disclosure, the isolation walls 112 have a rectangular, trapezoidal, inversely trapezoidal, or a triangular shape in a cross-sectional view.

Figure 2:
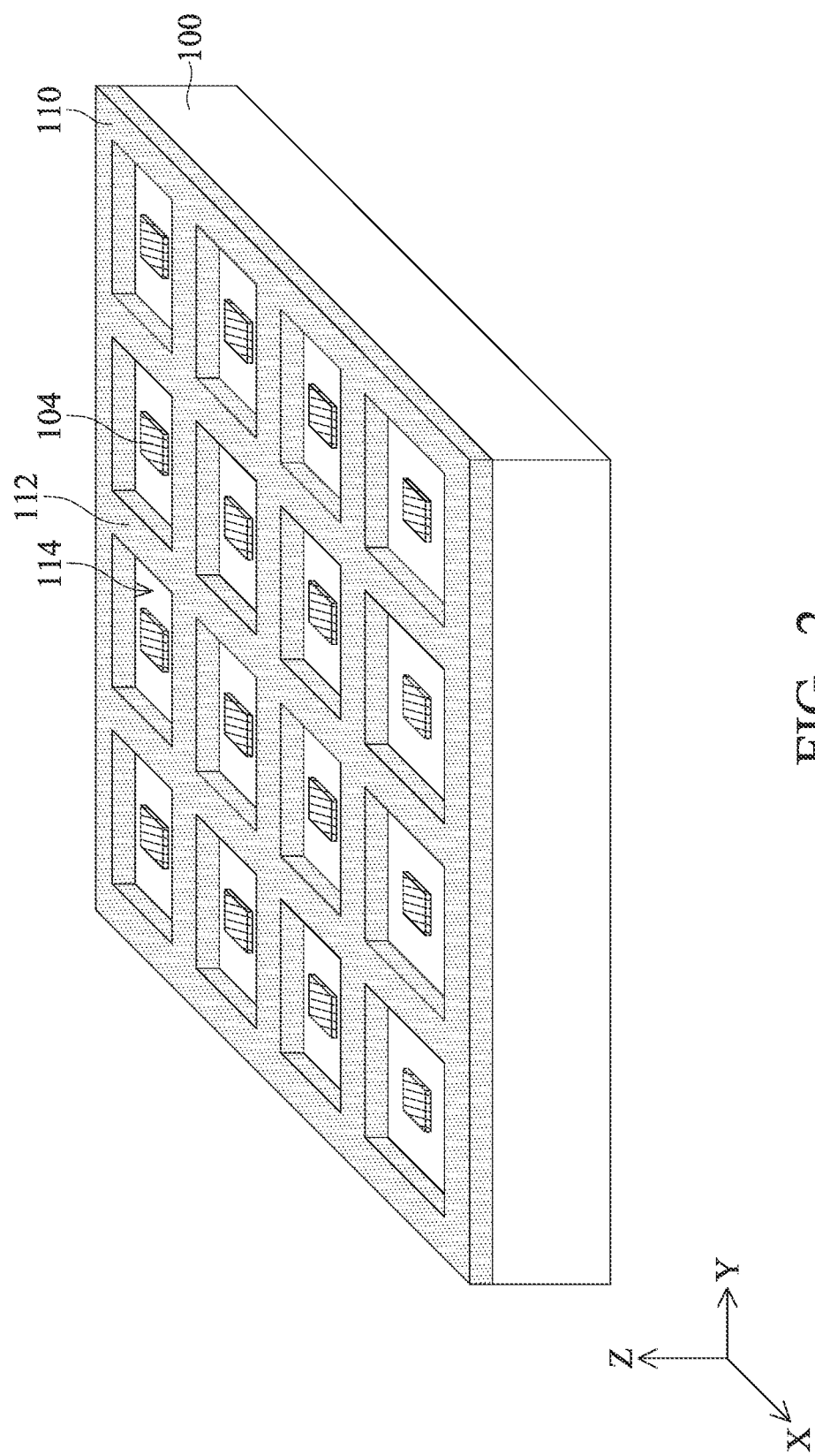
FIG. 2 illustrates a schematic diagram of an intermediate stage in the manufacturing of the image sensor corresponding to FIG. 1B, in accordance with some embodiments of the present disclosure.

FIG. 2 illustrates a schematic diagram of an intermediate stage in the manufacturing of the image sensor corresponding to FIG. 1B, in accordance with some embodiments of the present disclosure. The isolation structure 110 may define an array of the pixel regions 114 on the substrate 100, wherein the conductive portions 104 are exposed in each of the pixel regions 114. In addition, as shown in FIG. 2, the isolation walls 112 are portions of the isolation structure 110 between adjacent ones of the pixel regions, wherein each of the plurality of the pixel regions 114 is surrounded by the isolation walls 112, and the pixel regions 114 are separated from each other by these isolation walls 112 of the isolation structure 110. By forming the isolation structure 110, a subsequently formed organic photoelectric layer (for example, a subsequently formed photoelectric conversion layer 120) can be formed within the corresponding pixel regions 114, and thus electron/hole cross-talk in the organic photoelectric layer among pixel regions 114 will be prevented.

The isolation structure 110 may include electrically non-conductive materials, such as silicon nitride, silicon oxide, aluminum oxide, photoresist, other suitable materials, or a combination thereof. The formation of the isolation structure 110 may include using suitable deposition techniques, such as physical vapor deposition (PVD), chemical vapor deposition (CVD), atomic layer deposition (ALD), spin coating, combinations thereof, or the like. After the materials for the isolation structure 110 is deposited, photolithography and etching processes are performed to form the isolation structure 110. The cross-sectional profile of the isolation walls 112 may be adjusted by the etching conditions to obtain desired shapes.

Figure 1C:
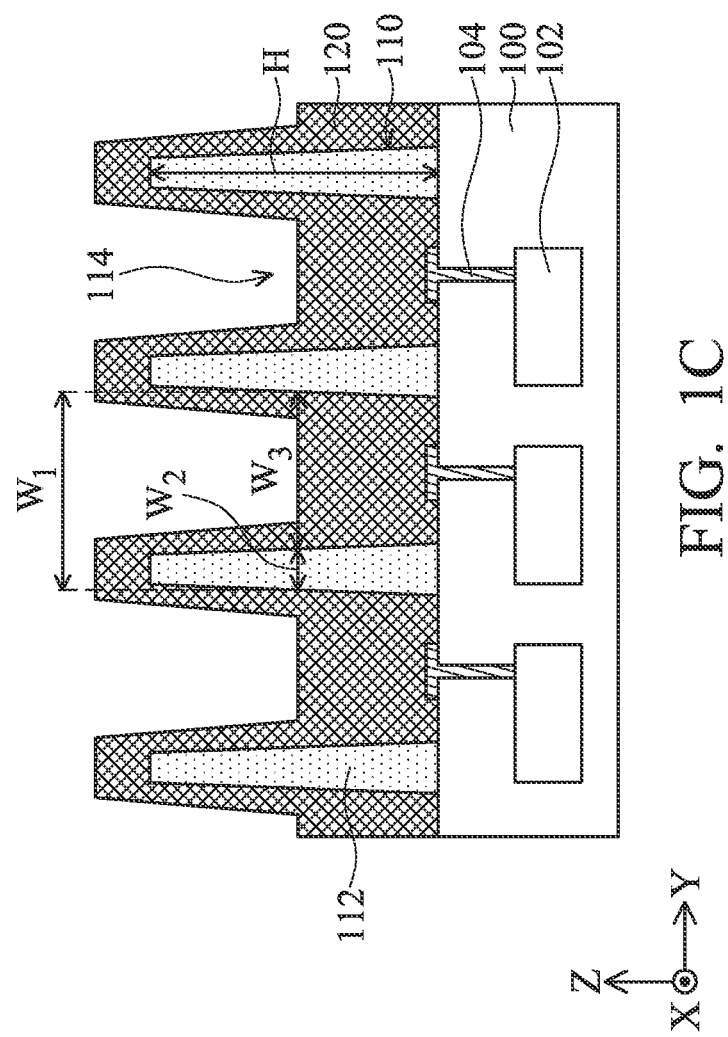

After the formation of the isolation structure 110, referring to FIG. 1C, a photoelectric conversion layer 120 is formed on the pixel regions 114 defined by the isolation structure 110. As shown in FIG. 1C, the photoelectric conversion layer 120 extends continuously across adjacent ones of the pixel regions 114, wherein in some embodiments, the photoelectric conversion layer 120 completely covers the sidewalls of the isolation walls 112. In some other embodiment, the photoelectric conversion layer 120 exposes at least a portion of the sidewalls of the isolation walls 112. For example, an upper portion of the sidewalls of the isolation walls 112 may be exposed. In some embodiments, the thickness of the photoelectric conversion layer 120 on a top surface of the substrate 100 is about 100 nm to about 700 nm. By forming the above isolation structure, electron/hole cross-talk in the photoelectric conversion layer 120 among pixel regions 114 will be prevented, which allows the image sensor with smaller pixel size to be formed without cross-talk adversely affecting the performance of the image sensor.

In some embodiments, as shown in FIG. 1C, the photoelectric conversion layer 120 may be electrically connected to the conductive portion 104 exposed in each of the pixel regions 114, and the photoelectric conversion layer 120 is thus electrically connected to the sensing devices 102. In such configuration, the signal charges generated by the photoelectric conversion layer 120 are collected by the sensing devices 102 through the conductive portion 104. Therefore, these signal charges are processed in elements (such as a charge storage portion, a signal readout circuit, combinations thereof, or the like) contained in the sensing devices 102.

The photoelectric conversion layer 120 may include a photoelectric conversion material that absorbs light irradiation and generates signal charges corresponding to an amount of the absorbed light, such as an organic material, a perovskite material, a quantum dots material, other suitable materials, or a combination thereof. The photoelectric conversion layer 120 may be formed by a deposition process including spin coating, thermal evaporation, combinations thereof, or the like.

Figure 1D:
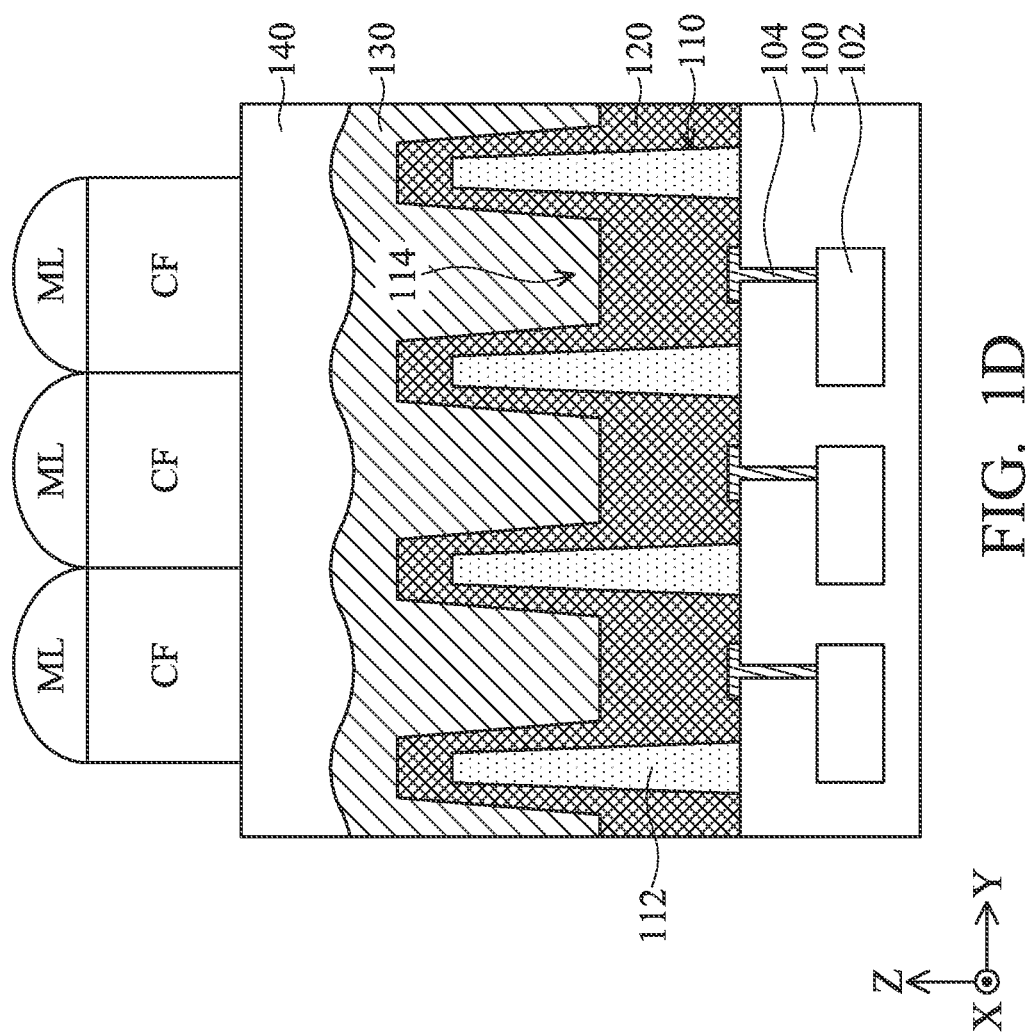

According to some embodiments of the present disclosure, as shown in FIG. 1D, a pixel width W1 of the isolation structure 110 is defined as the sum of the average width W2 of each of the isolation walls 112 and the average width W3 of the pixel regions 114. The value of the pixel width W1 is not particularly limited in the present disclosure. In some embodiments, the pixel width W1 of the resulting image sensor is less than 20 μm.

The refractive index of the isolation structure 110 is not particularly limited in the present disclosure. In some embodiments of the present disclosure, the refractive index of the isolation structure 110 may be between 1.1 and 2.5. For example, the refractive index of the isolation structure 110 may be between 1.1 and 1.6. In some embodiments, a material with a higher refractive index (such as silicon nitride, aluminum oxide, or the like with a refractive index higher than 1.6) may provide the isolation structure 110 with better water/oxygen resistance. In some other embodiments, a material with a lower refractive index (such as silicon oxide, photoresist, or the like with a refractive index lower than 1.6), may provide the isolation structure 110 with higher optical efficiency. In the case where the isolation structure 110 is formed with a lower refractive index, light penetrating the isolation walls 112 is decreased due to the total internal reflection, thereby improving the light absorption and quantum efficiency of the image sensor.

Again, with reference to FIG. 1C, the height H and the average width W2 of each of the isolation walls 112 are not particularly limited in the present disclosure. For example, the height H of the isolation structure 110 may be between 0.5 μm and 1.5 μm, and the average width W2 of each of the isolation walls 112 may be between 10 nm and 100 nm. In the embodiments where the photoelectric conversion layer 120 extends continuously across adjacent ones of the pixel regions 114, the portion of the photoelectric conversion layer 120 on the surface of the isolation walls forms a passage for electron/hole drifting. Therefore, the electron/hole generated in the photoelectric conversion layer 120 may drift in the passage along the isolation walls 112.

It should be noted that the passage length for electron/hole generated in the photoelectric conversion layer 120 is determined by controlling the sidewall angle, the average width W2, and the height H of the isolation walls 112. In the present disclosure, the above passage length is defined as the shortest distance for electron/hole drifting across two adjacent ones of the pixel regions 114. Since the diffusion length of electron/hole in the photoelectric conversion layer 120 varies in different kinds of materials of the photoelectric conversion layer 120, the sidewall angle, the average width W2, and the height H of the isolation walls 112 may be chosen corresponding to the material of the photoelectric conversion layer 120, such that the passage length for electron/hole drifting is longer than the diffusion length of electron/hole in the photoelectric conversion layer 120. For example, the passage length for electron/hole drifting may be configured to be longer than 1 μm, while in some other embodiments, the passage length is configured to be longer than 2 μm. Once the passage length is configured to be longer than the diffusion length of electron/hole in the photoelectric conversion layer 120, the electron/hole will be blocked by the isolation structure 110 and will not drift to other pixel regions 114 directly, and thereby electron/hole cross-talk in the photoelectric conversion layer 120 among pixel regions 114 will be prevented.

Figure 3A:
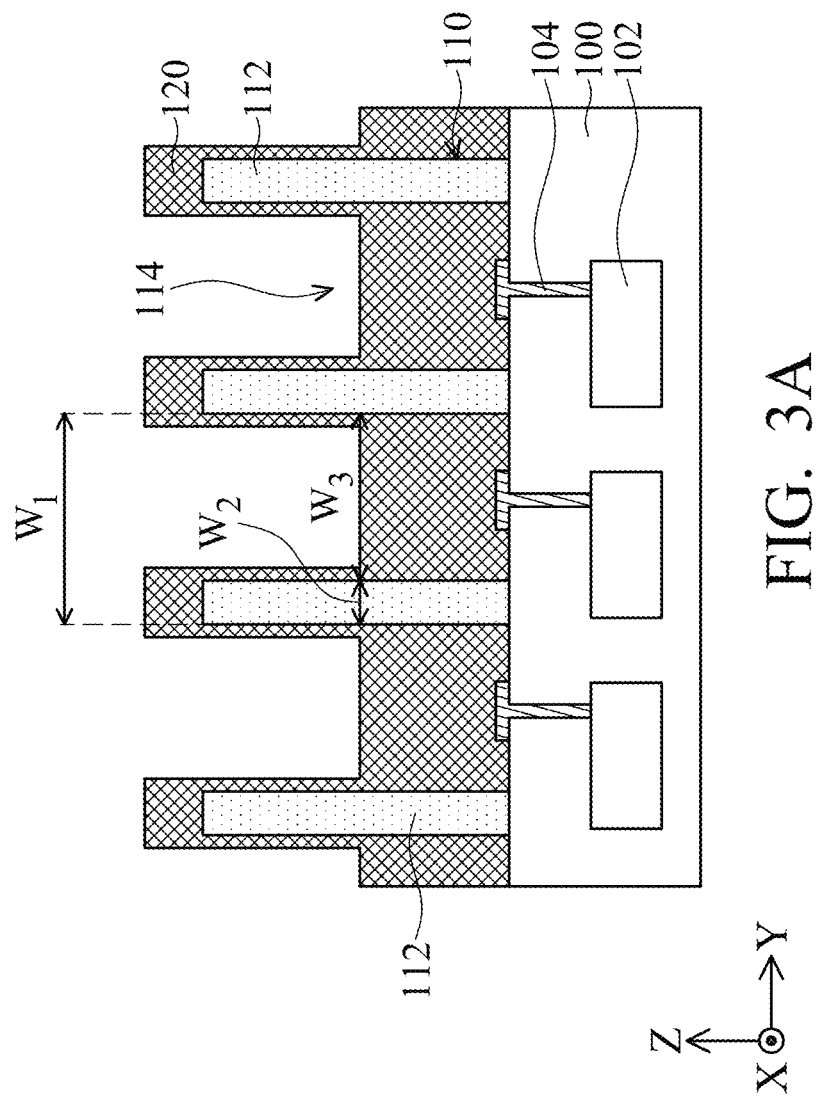
FIGS. 3A-3C illustrate cross-sectional views of intermediate stages in the manufacturing of an image sensor, in accordance with some other embodiments of the present disclosure.
Figure 3B:
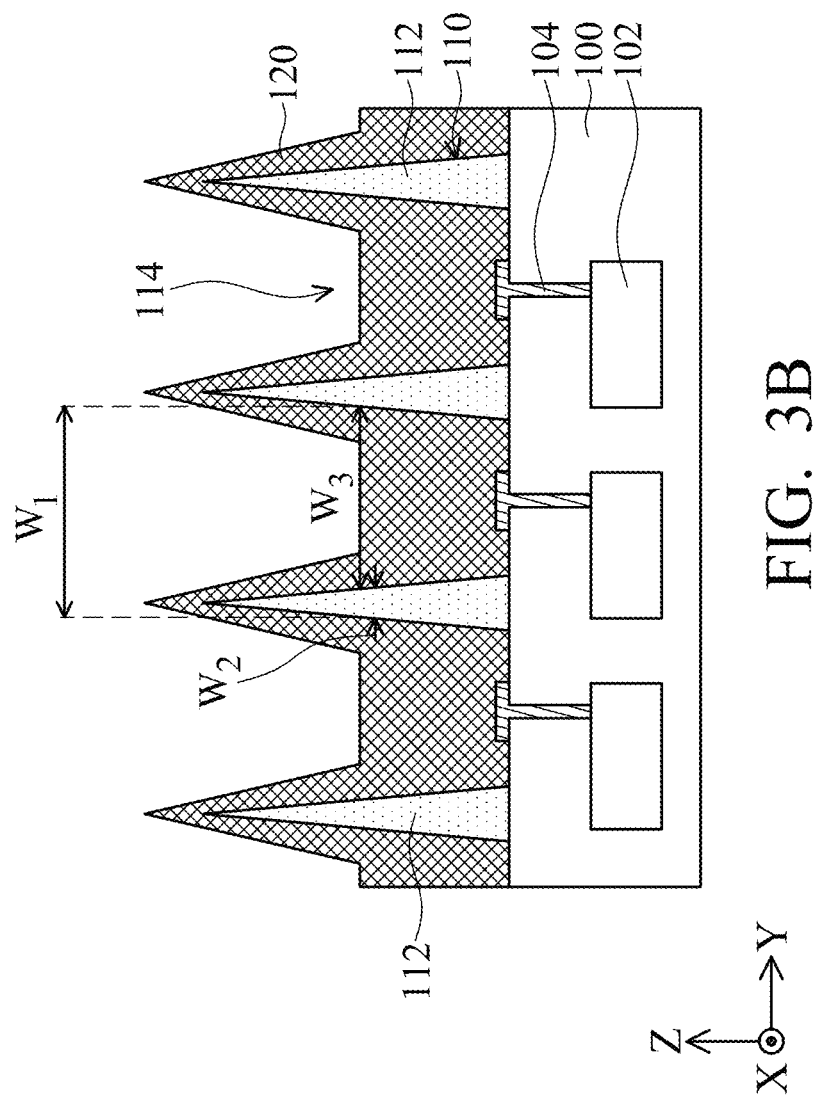
Figure 3C:
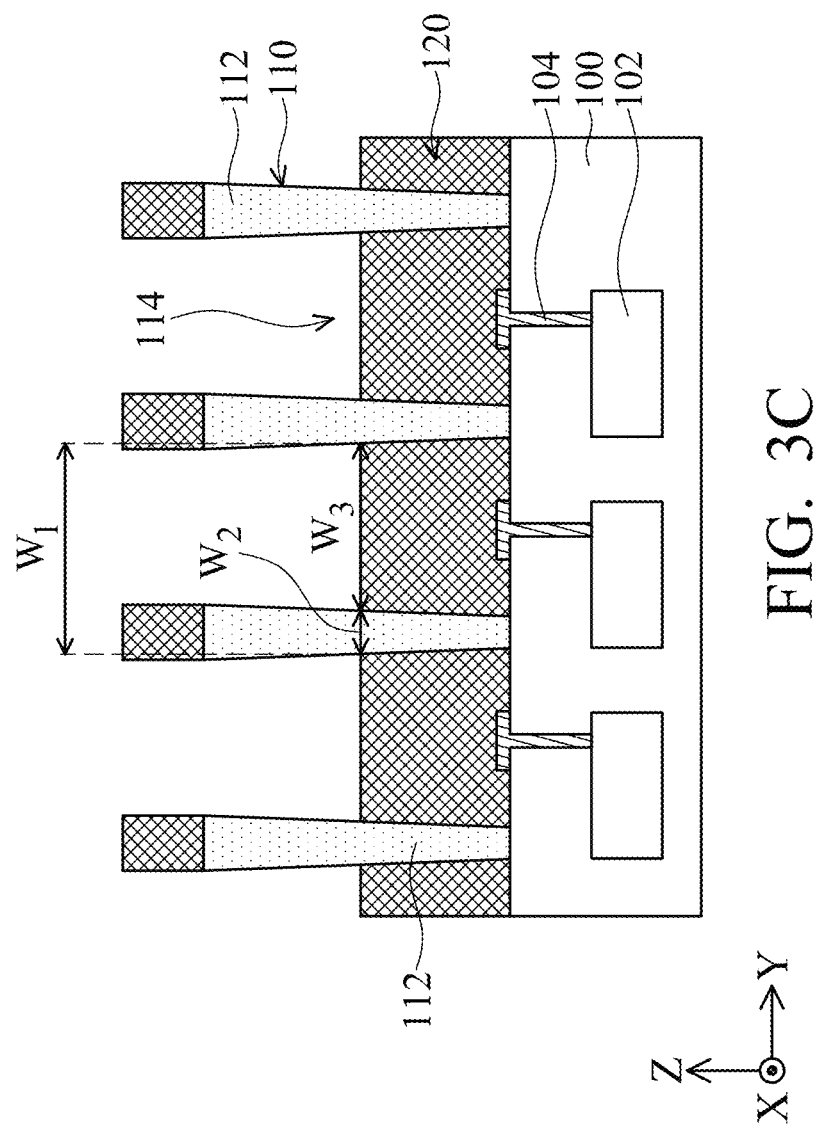

FIGS. 3A-3C illustrate cross-sectional views of structural variants of the isolation structure 110, in accordance with some other embodiments of the present disclosure. As illustrated in FIGS. 3A-3C, the isolation walls 112 may be formed as different shapes in a cross-sectional view, such as a rectangular shape, a triangular shape, a trapezoidal shape, or an inversely trapezoidal shape. In addition, depending on the sidewall angles of the isolation walls 112, the photoelectric conversion layer 120 may or may not extend continuously across adjacent ones of the pixel regions 114.

Referring to FIG. 3A, in some embodiments, the sidewall angles of the isolation walls 112 is formed to be a right angle, and the shape of the isolation walls 112 is rectangular in a cross-sectional view. In this case, the photoelectric conversion layer 120 may extend continuously across adjacent ones of the pixel regions 114, wherein the photoelectric conversion layer 120 may completely cover the top surface and the sidewalls of each of the isolation walls 112.

Referring to FIG. 3B, in some other embodiments, the sidewall angles of the isolation walls 112 is formed to be smaller than 90°, and the shape of the isolation walls 112 is triangular in a cross-sectional view. Also, the shape of the isolation walls 112 may be trapezoidal shapes, wherein there is a flat top surface on each of the isolation walls 112 (for example, the isolation walls 112 in FIG. 1C). In these cases where the sidewall angles are smaller than 90°, the photoelectric conversion layer 120 may also extend continuously across adjacent ones of the pixel regions 114. Therefore, in the embodiments where the sidewall angles of the isolation walls 112 is formed to be smaller than 90°, the photoelectric conversion layer 120 may completely cover the top surface and the sidewalls of each of the isolation walls 112.

Referring to FIG. 3C, in yet some other embodiments, the sidewall angles of the isolation walls 112 is formed to be larger than 90°, and the shape of the isolation walls 112 is inversely trapezoidal in a cross-sectional view, wherein the top surface of isolation walls 112 is larger than the bottom surface of the isolation walls 112. In this case, the photoelectric conversion layer 120 may not extend continuously across adjacent ones of the pixel regions 114, and the photoelectric conversion layer 120 may exposes at least a portion of the sidewalls of the isolation walls 112. Since the photoelectric conversion layer 120 do not extend continuously across adjacent ones of the pixel regions 114, the portions of photoelectric conversion layer 120 between the adjacent ones of the pixel regions 114 fails to form a passage for electron/hole drifting, and thereby electron/hole crosstalk in the photoelectric conversion layer 120 among pixel regions 114 will be further prevented.

Next, referring to FIG. 1D, subsequent layers are formed over the isolation structure 110 and the photoelectric conversion layer 120 to complete the formation of the image sensor. First, a transparent electrode layer 130 may be formed over the photoelectric conversion layer 120. The transparent electrode layer 130 may be used as a top electrode of the photoelectric conversion layer 120 in order to read out electrical signals of the photoelectric conversion layer 120. With its high transmittance (for example, larger than 50%), the transparent electrode layer 130 may allow the incident light to pass through and enter the photoelectric conversion layer 120. As shown in FIG. 1D, the transparent electrode layer 130 may be formed to completely cover the underlying photoelectric conversion layer 120, wherein a top surface of the transparent electrode layer 130 may be uneven and correspond to the underlying topography of the photoelectric conversion layer 120. The transparent electrode layer 130 may include a transparent conductive material, such as ITO, IZO, ZnO, PEDOT-PSS, other suitable materials, or a combination thereof. The formation of the transparent electrode layer 130 may include using suitable deposition techniques, such as sputtering deposition, spin coating, thermal evaporation, combinations thereof, or the like. In some embodiments, the transparent electrode layer 130 is formed as a thickness from about 0.5 μm to about 1 μm. However, any suitable thickness may be utilized.

Once the transparent electrode layer 130 is formed, an encapsulation layer 140 may be formed over the transparent electrode layer 130. In some embodiments, the encapsulation layer 140 may be formed as a flat top surface. For example, the encapsulation layer 140 may be planarized with a planarization process, such as a chemical mechanical polishing (CMP) process, to form a substantially flat top surface. Therefore, the conductive transparent electrode layer 130 may be encapsulated by the encapsulation layer 140, and the encapsulation layer 140 may provide a flat top surface for subsequent formation of a color filter layer and a micro-lens layer which includes, for example, color filters CF and micro-lens ML, respectively. The encapsulation layer 140 may include silicon nitride, silicon oxide, aluminum oxide, other suitable materials, or a combination thereof. The formation of the encapsulation layer 140 may include using suitable deposition techniques, such as CVD, ALD, spin-on coating combinations thereof, or the like. In some embodiments, the encapsulation layer 140 is formed as a thickness larger than about 0.3 μm. However, any suitable thickness may be utilized.

Next, a color filter layer may be formed over the encapsulation layer 140. The color filter layer may include a plurality of color filters CF disposed corresponding to the pixel regions 114, wherein the plurality of color filters CF may include color filters for allowing different wavelengths of light to penetrate, such as a red color filter, a green color filter, and a blue color filter, other kinds of color filters, or a combination thereof. Although each of the color filters CF in FIG. 1D are illustrated as corresponding to each of the pixel regions 114, it should be noted that the present disclosure is not limited to such configuration. In some embodiments, one color filter CF is disposed corresponding to a plurality of pixel regions 114, while in some other embodiments, a plurality of color filters CF are disposed corresponding to the same pixel region 114. In yet some other embodiments, some of the pixel regions 114 may not be covered by the color filter layer. In some embodiments, the color filters CF may be disposed in certain regular pattern. For example, the color filters CF may be disposed according to a Bayer Pattern. However, any suitable pattern and configuration of color filters CF may be utilized. In addition, the color filter layer may be formed in a deposition process at a lower temperature, such as a temperature lower than 120° C., and thereby the materials of the photoelectric conversion layer 120 may undergo less decomposition and the performance of the resulting image sensor may be improved.

Following the formation of the color filter layer, a micro-lens layer may be formed on the color filter layer. The micro-lens layer may include a plurality of micro-lenses ML disposed corresponding to the color filters CF. Although each of the micro-lens ML in FIG. 1D are illustrated as corresponding to each of the color filters CF, it should be noted that the present disclosure is not limited to such configuration. In some embodiments, one micro-lenses ML is disposed corresponding to a plurality of color filters CF, while in some other embodiments, a plurality of micro-lens are disposed corresponding to the same color filter CF. In yet some other embodiments, some of the color filters CF may not be covered by the micro-lenses ML. The material of the micro-lenses ML may include glass, epoxy resin, silicone resin, polyurethane, any other applicable material, or a combination thereof, but the present disclosure is not limited thereto. As described above, the micro-lens layer may be formed at a lower temperature, such as a temperature lower than 120° C., and thereby the materials of the photoelectric conversion layer 120 may undergo less decomposition and the performance of the resulting image sensor may be improved.

Each of the micro-lens ML may be a semi-convex lens or a convex lens, but the present disclosure is not limited thereto. In some other embodiments, each of the micro-lenses ML may be replaced with a condensing structure, such as a micro-pyramid structures (e.g., circular cone, quadrangular pyramid, and so on), or a micro-trapezoidal structures (e.g., flat top cone, truncated square pyramid, and so on). Alternatively, the condensing structure may be a gradient-index structure.

FIGS. 4A-4G illustrate cross-sectional views of intermediate stages in the manufacturing of an image sensor, in accordance with yet other embodiments of the present disclosure. In these embodiments, different from the embodiments of forming an image sensor in FIGS. 1A-1D, the image sensor is formed to include an isolation cap disposed on a top surface of the isolation structure, wherein a width of the isolation walls is smaller than a width of the isolation cap. In addition, the isolation cap comprises an inorganic material and the isolation structure comprises an organic material. By forming this isolation cap, the electron/hole cross-talk in the photoelectric conversion layer among the pixel regions will be further prevented. The detailed manufacturing process of forming the image sensor including the isolation cap are illustrated and described below with respect to FIGS. 4A-4G, wherein similar elements are indicated with similar reference numerals as recited in FIGS. 1A-1D.

Figure 4A:
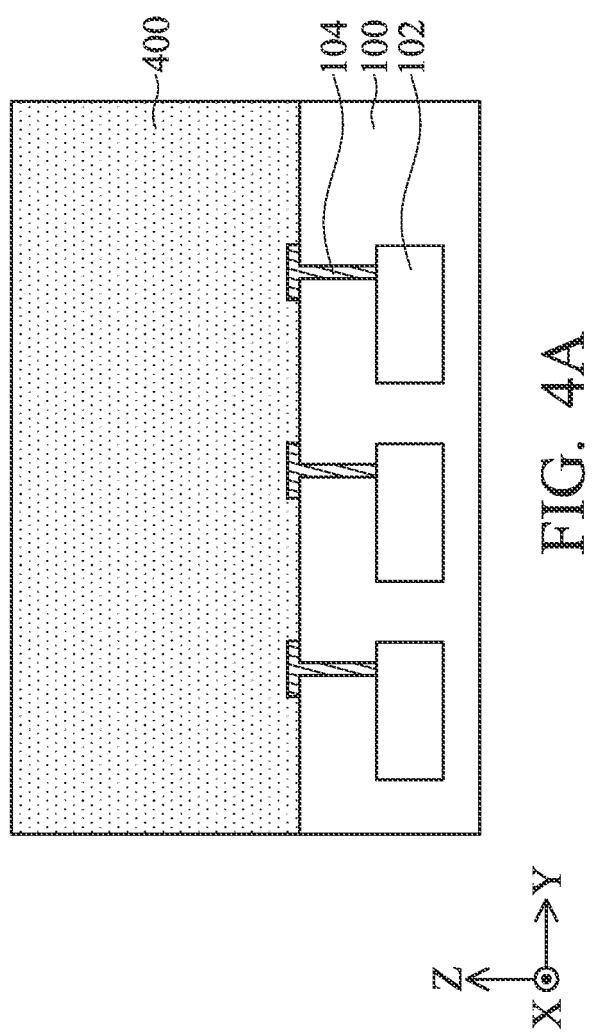
FIGS. 4A-4F illustrate cross-sectional views of intermediate stages in the manufacturing of an image sensor, in accordance with some other embodiments of the present disclosure.

Referring to FIG. 4A, an organic material layer 400 may be formed on the substrate 100. The thickness of the organic material layer 400 is not particularly limited in the present disclosure. For example, the thickness of the organic material layer 400 may be between 0.5 µm and 1.5 µm. The organic material layer 400 may include an organic material feasible for subsequent patterning processes, such as a photoresist, although any suitable materials may be utilized. The formation of the organic material 400 may include using suitable deposition techniques, such as spin coating, bar coating, ink-jet coating, combinations thereof, or the like.

Figure 4B:
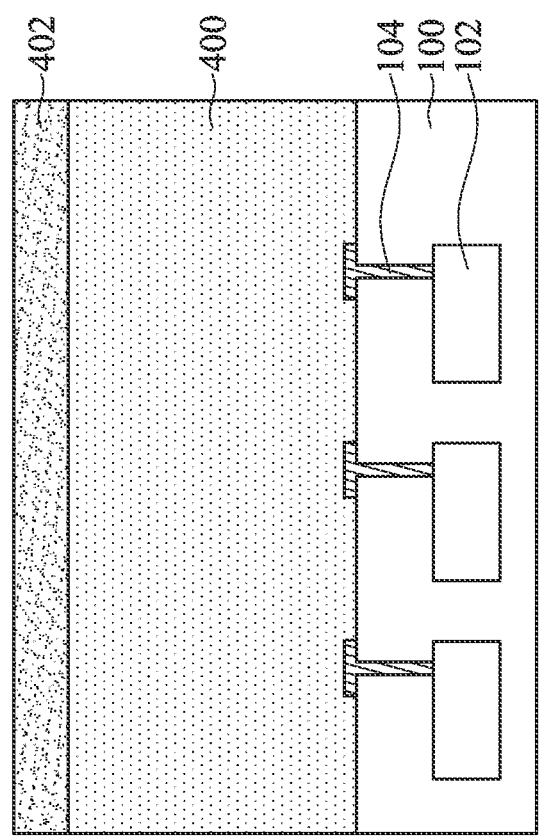

Referring to FIG. 4B, an inorganic material layer 402 may be formed covering a top surface of the organic material layer 400. The thickness of the inorganic material layer 402 is not particularly limited in the present disclosure. For example, the thickness of the organic material layer 400 may be between 200 nm and 800 nm. The inorganic material layer 402 may include silicon nitride, silicon oxide, aluminum oxide, combinations thereof, or the like, although any suitable materials may be utilized. The formation of the inorganic material 402 may include using suitable deposition techniques, such as physical vapor deposition (PVD), chemical vapor deposition (CVD), atomic layer deposition (ALD), spin coating, combinations thereof, or the like.

Figure 4C:
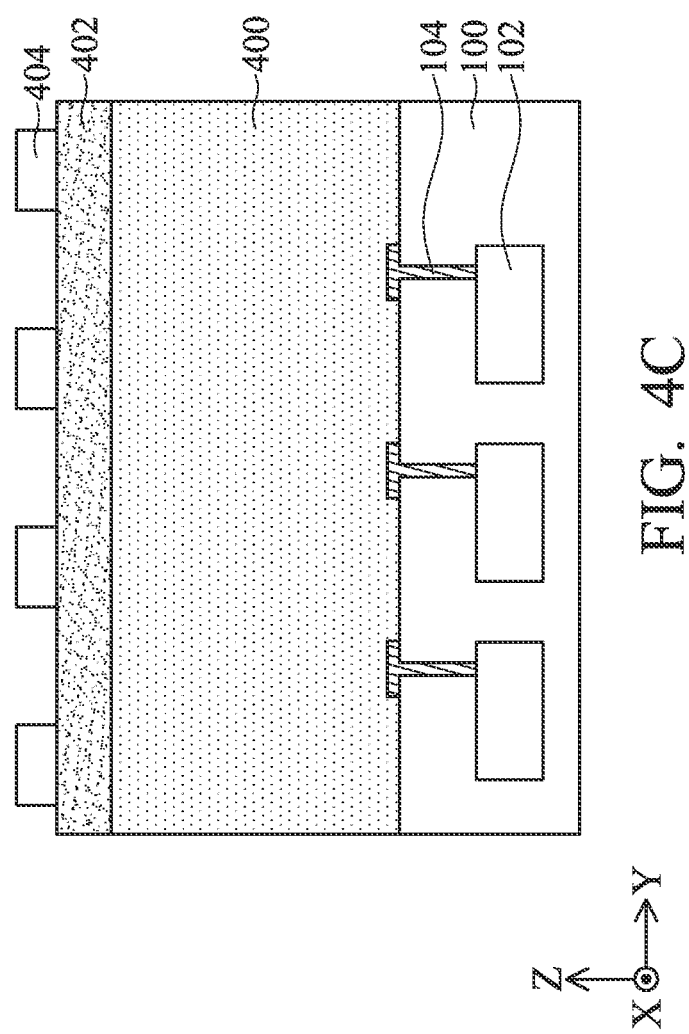

Then, referring to FIG. 4C, a patterned mask layer 404 may be formed on the inorganic material layer 402 to serve as an etch mask for subsequent etching of the inorganic material layer 402. The patterned mask layer 404 may, for example, include photoresist, epoxy, resin, other suitable materials, or a combination thereof. The formation of the patterned mask layer 404 may include using suitable deposition techniques, such as physical vapor deposition (PVD), chemical vapor deposition (CVD), atomic layer deposition (ALD), spin coating, combinations thereof, or the like. Then, the above deposition techniques are followed by suitable photolithography and etching processes to form a desired pattern corresponding to subsequently formed pixel regions.

Figure 4D:
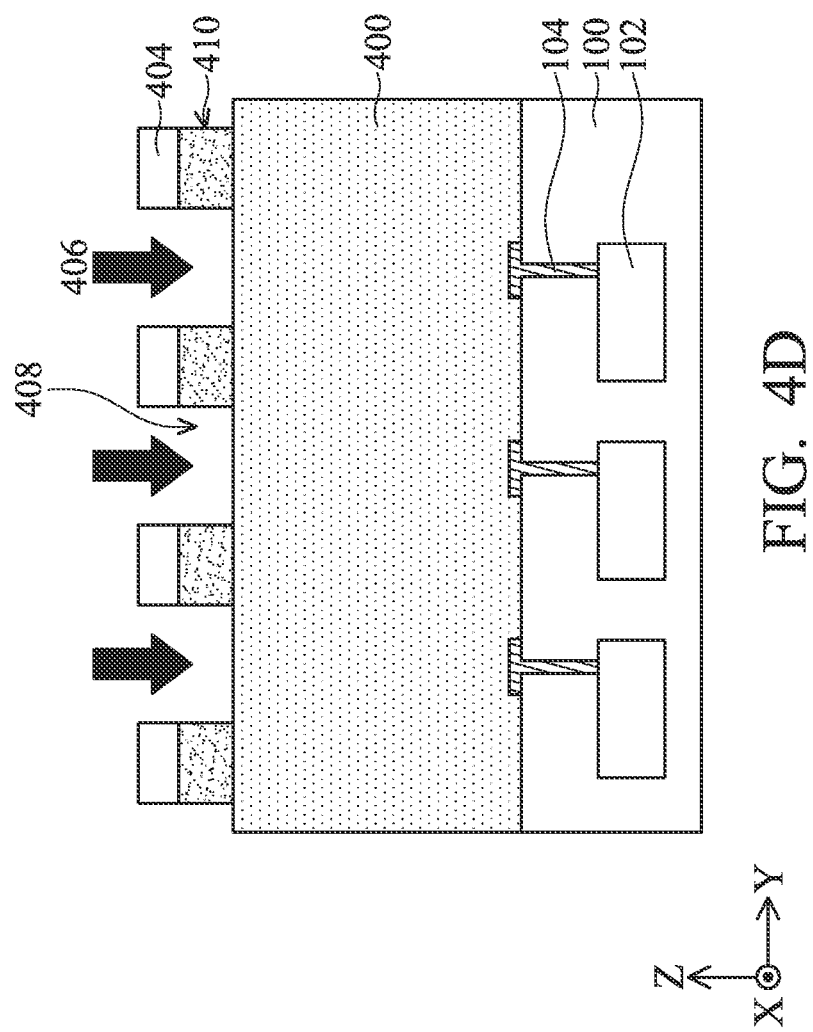
Figure 4E:
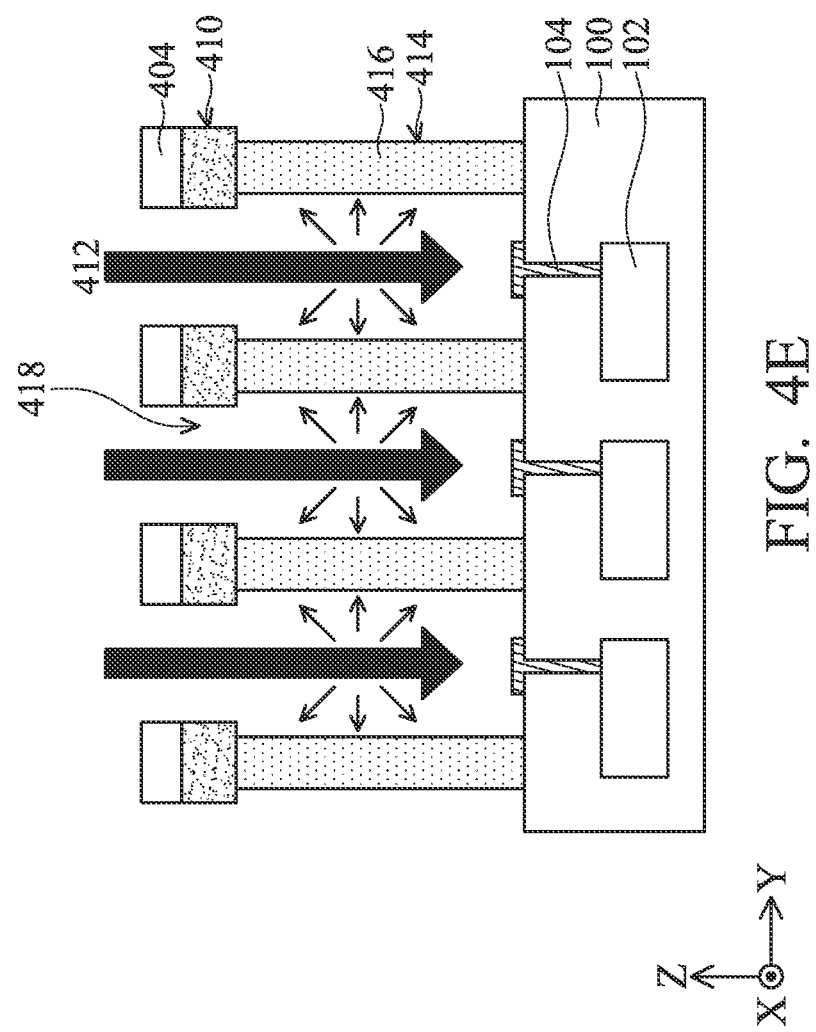

After the formation of the patterned mask layer 404, referring to FIG. 4D, a first etching process 406 is performed on the inorganic material layer 402 to form openings 408 and an isolation cap 410 surrounding the openings 408, wherein the first etching process 406 is performed until at least a portion of the organic material layer 400 is exposed. The first etching process 406 may be an anisotropic etching process, such that a portion of the inorganic material layer 402 directly under the patterned mask layer 404 remains substantially unetched. In some embodiments, the inorganic material layer 402 is removed using, for example, a wet or dry etching process that utilizes etchants that are selective to the material of the inorganic material layer 402, while the underlying organic material layer 400 remains unetched. For example, the first etching process 406 may utilize an etchant including $CF_4$, $C_4F_8$, combinations thereof, or the like to remove the portion of the inorganic material layer 402 not covered by the patterned mask layer 404. However, any suitable removal process for the inorganic material layer 402 may be utilized.

Additionally, the patterned mask layer 404 that covers the isolation cap 410 may be removed after the first etching process 406. In an embodiment the patterned mask layer 404 may be removed using, for example, a wet or dry etching process that is selective to the material of the patterned mask layer 404. However, the patterned mask layer 404 may also remain on the isolation cap 410 during subsequent etching processes.

After the organic material layer 400 is exposed by the first etching process 406, a second etching process 412 may be performed on the organic material layer 400 to form the isolation structure 414 with the isolation walls 416. The second etching process 412 is performed until the substrate 100 is exposed by the second etching process 412. The second etching process 412 may be an isotropic etching process so that the width of the isolation walls 416 is less than the width of the isolation cap 410. In addition, pixel regions 418 are defined by the resulting isolation structure 414. In some embodiments, the organic material layer 400 is removed using, for example, a wet etching or isotropic dry etching process that utilizes etchants that are selective to the material of the organic material layer 400, while the above isolation cap 410 and the underlying substrate 100 and exposed conductive portion 104 remain unetched. For example, the second etching process 412 may utilize an etchant including $CO_2$, $N_2$, combinations thereof, or the like to remove a portion of the inorganic material layer 402. However, any suitable removal process for the organic material layer 400 may be utilized. Then, the remained patterned mask layer 404 (if any) that covers the isolation cap 410 may be removed after the second etching process 412. In an embodiment the patterned mask layer 404 may be removed using, for example, a wet or dry etching process that is selective to the material of the patterned mask layer 404.

Figure 4F:
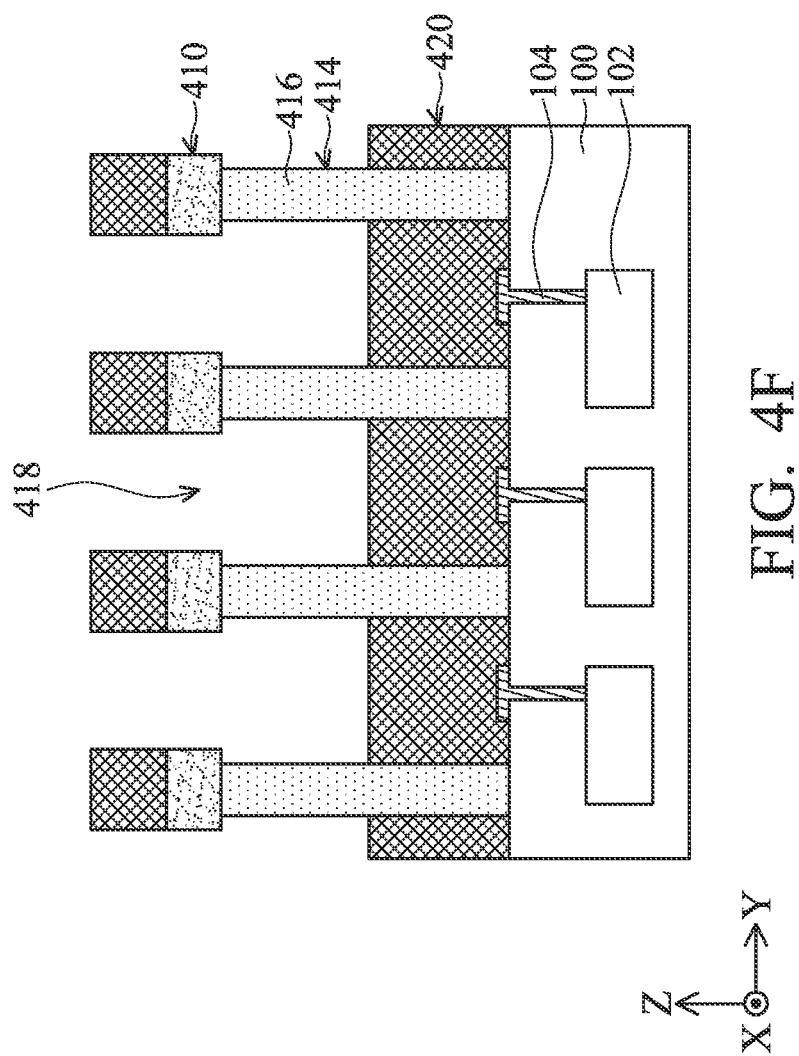

After the formation of the isolation structure 414, referring to FIG. 4F, a photoelectric conversion layer 420 is formed on the pixel regions 418 defined by the isolation structure 414. As shown in FIG. 4F, the photoelectric conversion layer 420 may not extend continuously across adjacent ones of the pixel regions 418, and the photoelectric conversion layer 420 may exposes at least a portion of sidewalls of the isolation walls 416. Since the photoelectric conversion layer 420 do not extend continuously across adjacent ones of the pixel regions 418, the portions of photoelectric conversion layer 420 between the adjacent ones of the pixel regions 418 fails to form a passage for electron/hole drifting, and thereby electron/hole cross-talk in the photoelectric conversion layer 420 among pixel regions 418 will be further prevented.

In some embodiments, as shown in FIG. 4F, the photoelectric conversion layer 420 may be electrically connected to the conductive portion 104 exposed in each of the pixel regions 418, and the photoelectric conversion layer 420 is thus electrically connected to the sensing devices 102. In such configuration, the signal charges generated by the photoelectric conversion layer 420 are collected by the sensing devices 102 through the conductive portion 104. Therefore, these signal charges are processed in elements (such as a charge storage portion, a signal readout circuit, combinations thereof, or the like) included in the sensing devices 102.

The photoelectric conversion layer 420 may include similar materials and may be formed by similar deposition process as the photoelectric conversion layer 120 as described above. For example, the photoelectric conversion layer 420 may include a photoelectric conversion material that absorbs light irradiation and generates signal charges corresponding to an amount of the absorbed light, such as an organic material, a perovskite material, a quantum dots material, other suitable materials, or a combination thereof. The photoelectric conversion layer 420 may be formed by a deposition process including spin coating, thermal evaporation, combinations thereof, or the like.

After the formation of the photoelectric conversion layer 420, a transparent electrode layer, encapsulation layer, color filter layer, and a micro-lens layer may be formed sequentially over the photoelectric conversion layer 420 according to the suitable materials and manufacturing processes described above, which is not repeated here for the sake of brevity.

In summary, according to some embodiments of the disclosure, an image sensor including an electrically non-conductive isolation structure among pixels is provided. In particular, a photovoltaic material for an image sensor may be patterned by the isolation structure to form a photoelectric conversion layer covering at least a portion of the isolation structure. By forming the above isolation structure, electron/hole cross-talk in the organic material among pixels will be prevented, which allows the image sensor with smaller pixel size to be formed without cross-talk adversely affecting the performance of the image sensor.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An image sensor, comprising:
a substrate;
an isolation structure disposed on the substrate, wherein the isolation structure is electrically non-conductive and defines a plurality of pixel regions on the substrate; and
a photoelectric conversion layer disposed on the pixel regions defined by the isolation structure, wherein the isolation structure prevents cross-talk of electrical signals in the photoelectric conversion layer among the pixel regions;
a transparent electrode layer disposed over the isolation structure and the photoelectric conversion layer;
an encapsulation layer disposed over the transparent electrode layer;
a color filter layer disposed over the encapsulation layer corresponding to the pixel regions; and
a micro-lens layer disposed on the color filter layer,
wherein the isolation structure comprises isolation walls, the isolation walls are portions of the isolation structure between adjacent ones of the plurality of pixel regions, and the isolation walls have a triangular or an inversely trapezoidal shape in a cross-sectional view.

2. The image sensor as claimed in claim 1, wherein the isolation structure comprises isolation walls, wherein the isolation walls are portions of the isolation structure between adjacent ones of the plurality of pixel regions, and an angle between a sidewall and a bottom surface of the isolation walls is between 60° and 120°.

3. The image sensor as claimed in claim 2, wherein the photoelectric conversion layer exposes at least a portion of sidewalls of the isolation walls.

4. The image sensor as claimed in claim 2, wherein the photoelectric conversion layer completely covers sidewalls of the isolation walls.

5. The image sensor as claimed in claim 2, wherein a height of the isolation walls is between 0.5 μm and 1.5 μm, and an average width of each of the isolation walls is between 10 nm and 100 nm.

6. The image sensor as claimed in claim 2, wherein a sum of an average width of each of the isolation walls and an average width of the pixel regions is less than 20 μm.

7. The image sensor as claimed in claim 1, further comprising an isolation cap disposed on a top surface of the isolation structure, wherein a width of the isolation walls is less than a width of the isolation cap.

8. The image sensor as claimed in claim 7, wherein the isolation cap comprises an inorganic material and the isolation structure comprises an organic material.

9. The image sensor as claimed in claim 1, wherein the photoelectric conversion layer extends continuously across adjacent ones of the pixel regions.

10. The image sensor as claimed in claim 1, wherein a refractive index of the isolation structure is between 1.1 and 2.5, and the isolation structure comprises silicon nitride, silicon oxide, aluminum oxide, photoresist, or a combination thereof.

11. The image sensor as claimed in claim 1, further comprising a sensing device embedded in each of the pixel regions of the substrate, and the sensing device is electrically connected to the photoelectric conversion layer through a conductive portion.

12. The image sensor as claimed in claim 1, further comprising:
a transparent electrode layer disposed over the isolation structure and the photoelectric conversion layer;
an encapsulation layer disposed over the transparent electrode layer;
a color filter layer disposed over the encapsulation layer corresponding to the pixel regions; and
a micro-lens layer disposed on the color filter layer.

* * * * *